(12) United States Patent
Huang (10) Patent No.: US 6,630,711 B2
(45) Date of Patent: *Oct. 7, 2003

(54) SEMICONDUCTOR STRUCTURES WITH TRENCH CONTACTS

(75) Inventor: Qin Huang, Blacksburg, VA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/187,560

(22) Filed: Jul. 2, 2002

(65) Prior Publication Data

US 2002/0195653 A1 Dec. 26, 2002

Related U.S. Application Data (60) Continuation of application No. 09/498,476, filed on Feb. 4, 2000, now Pat. No. 6,437,399, which is a division of application No. 08/885,922, filed on Jun. 30, 1997, now Pat. No. 6,037,628.

(51) Int. Cl.$^7$ .............................................. H01L 29/76
(52) U.S. Cl. ........................ 257/329; 257/329; 257/330
(58) Field of Search ................................ 257/329, 330, 257/331, 289, 334, 472; 438/430; 437/203

(56) References Cited

U.S. PATENT DOCUMENTS

| | | |
|---|---|---|
| 4,853,345 A | 8/1989 | Himelick |
| 5,071,782 A | 12/1991 | Mori |
| 5,366,914 A | 11/1994 | Takahashi et al. |
| 5,554,862 A | 9/1996 | Omura et al. |
| 5,623,152 A | 4/1997 | Majumdar et al. |
| 5,648,670 A | 7/1997 | Blanchard |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,719,409 A * | 2/1998 | Singh et al. .................. 257/77 |
| 5,879,971 A | 3/1999 | Witek |
| 6,037,628 A * | 3/2000 | Huang ........................ 257/329 |
| 6,110,799 A * | 8/2000 | Huang ........................ 438/430 |
| 6,437,399 B1 * | 8/2002 | Huang ........................ 257/329 |

FOREIGN PATENT DOCUMENTS

| | | |
|---|---|---|
| DE | 43 00 806 | 12/1993 |
| EP | 0 747 967 | 12/1996 |

OTHER PUBLICATIONS

Stanley Wolf, Silicon Processing for the VSLI Era vol. 2, Lattice Press, p. 55, 1990.

* cited by examiner

*Primary Examiner*—David Nelms
*Assistant Examiner*—Thinh T. Nguyen
(74) *Attorney, Agent, or Firm*—Thomas R. FitzGerald, Esq.

(57) ABSTRACT

Semiconductor structures such as the trench and planar MOSFETs (UMOS), trench and planar IGBTs and trench MCTs using trenches to establish a conductor. Improved control of the parasitic transistor in the trench MOSFET is also achieved and cell size and pitch is reduced relative to conventional structures.

5 Claims, 5 Drawing Sheets

SEMICONDUCTOR STRUCTURES WITH TRENCH CONTACTS

CROSS-REFERENCE TO RELATED APPLICATIONS

This application is a continuation of and claims the benefit of the filing date of U.S. patent application Ser. No. 09/498,476 filed Feb. 4, 2000 and now U.S. Pat. No. 6,437,399, which is a division of U.S. patent application Ser. No. 08/885,922 filed Jun. 30, 1997, and now U.S. Pat. No. 6,037,628 which is related to U.S. patent application Ser. No. 08/885,879 filed Jun. 30, 1997 and now U.S. Pat. No. 6,110,799.

BACKGROUND OF THE INVENTION

The present invention relates to semiconductor devices such a MOSFETs using trenches to establish electrical contact.

The conventional trench process for forming MOSFETs uses a total of six masks; i.e., 1. a first mask for defining a buried layer region in a semiconductor;
2. a second mask for defining an active area;
3. a source mask for source implantation;
4. a trench mask for defining the trench of etching and filling;
5. a contact mask to define the areas of contacts; and
6. a metal mask.

This process results in a relatively deep junction, wider cell pitch, wider source width and a stronger parasitic transistor problem.

Accordingly, it is an object of the present invention to provide a novel semiconductor structure made by a process which uses fewer masks.

It is another object of the present invention to provide a novel trench contact structure where the buried layer may selectively be controlled and made deeper than the depth of the trench gate.

It is yet another object of the present invention to provide novel structures for both trench and planar devices.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The novel process of the present invention will be illustrated in connection with a P channel MOSFET, but it is to be understood that the process is equally applicable to N channel MOSFETs and to other semiconductor structures.

Figure 1:
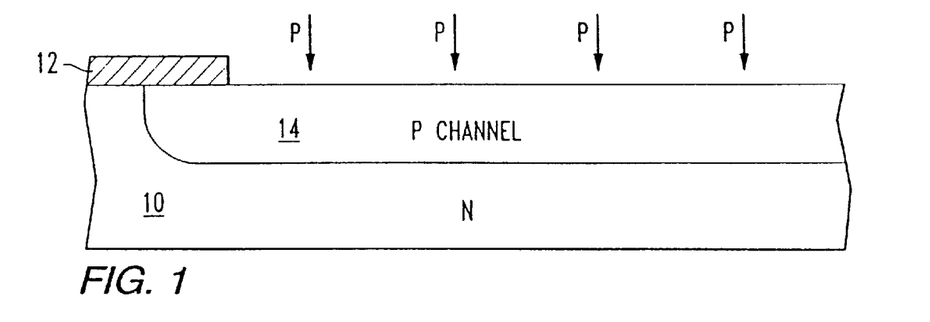
FIGS. 1–9 illustrate the sequence of steps in the novel process of the present invention.

With reference to FIG. 1, the surface of a N type semiconductor wafer 10 is masked by a conventional mask 12 to define an active region, and a P type impurity is implanted in a conventional manner and driven, e.g., by annealing, to form a P channel region 14.

Figure 2:
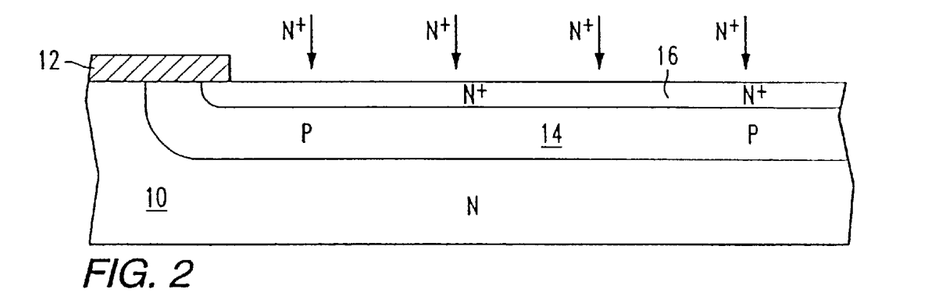

As shown in FIG. 2, a N type polarity impurity may then be implanted and driven into the channel area 14 to form a N+ source region 16 adjacent the surface of the wafer.

Figure 3:
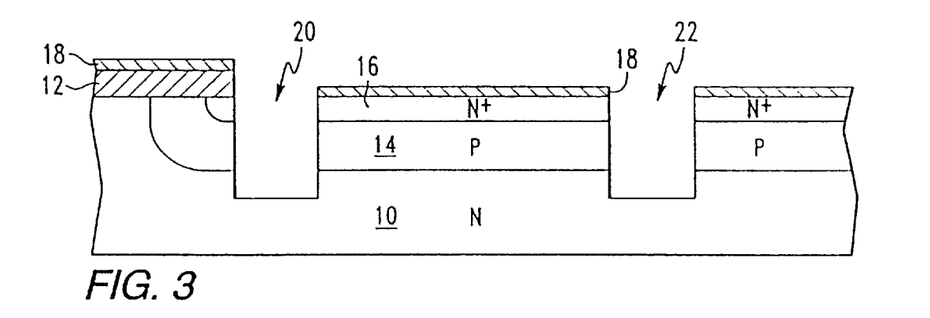

A second conventional mask 18 may then be used as shown in FIG. 3 to define the area for two trenches 20, 22. The trenches 20, 22 may then be etched in a suitable conventional manner downwardly through the N+ source region 16 and the P channel region 14 into N wafer.

Figure 4:
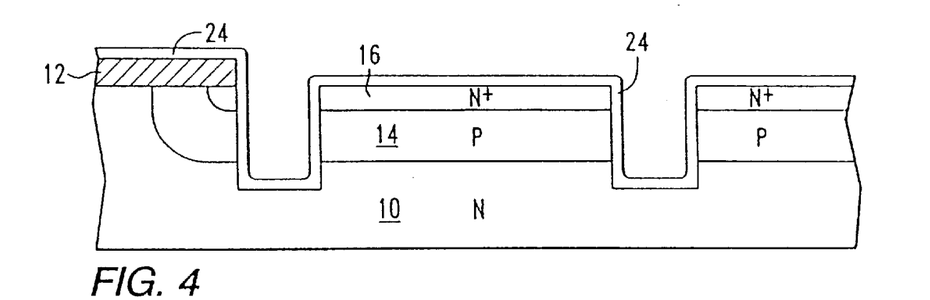

The second mask 18 of FIG. 3 may then be removed and a gate oxide layer 24 over all of the exposed upper surface of the semiconductor including the walls and bottom of the trenches 20, 22 as shown in FIG. 4.

Figure 5:
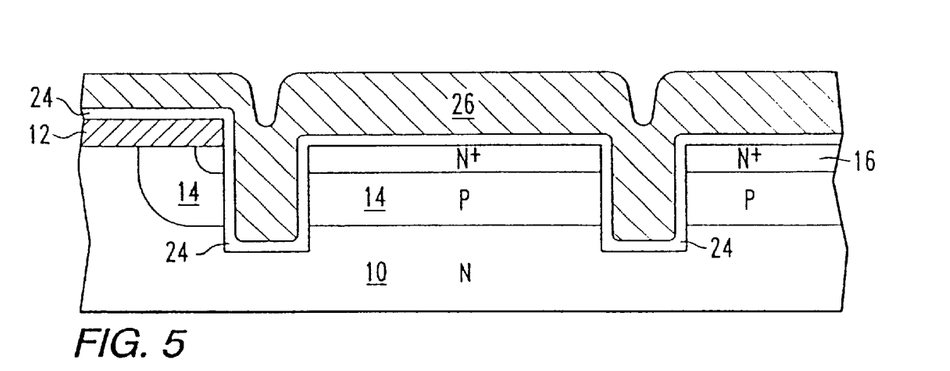

As shown in FIG. 5, a layer of polysilicon 26 may conventionally be provided over the gate oxide later 24, completely filling the trenches 20, 22.

Figure 6:
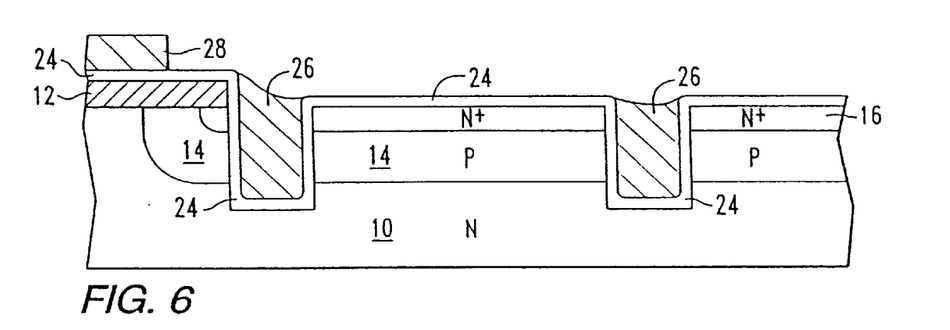

As shown in FIG. 6, a third mask 28 may then be provided to define an area larger than the active region defined by the mask 12 to protect the polysilicon layer 26 for establishing a contact at a later time. Thereafter, the polysilicon layer 26 left unprotected by the mask 28 may be etched back to leave polysilicon 26 only in the trenches 20, 22.

Figure 7:
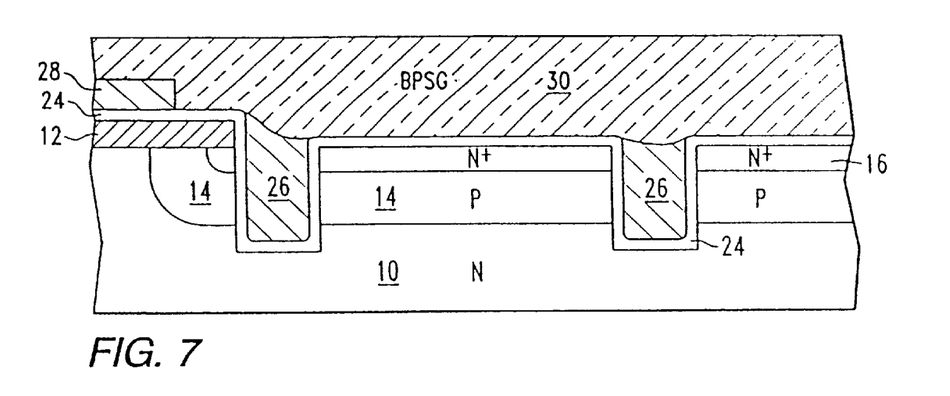
Figure 8:
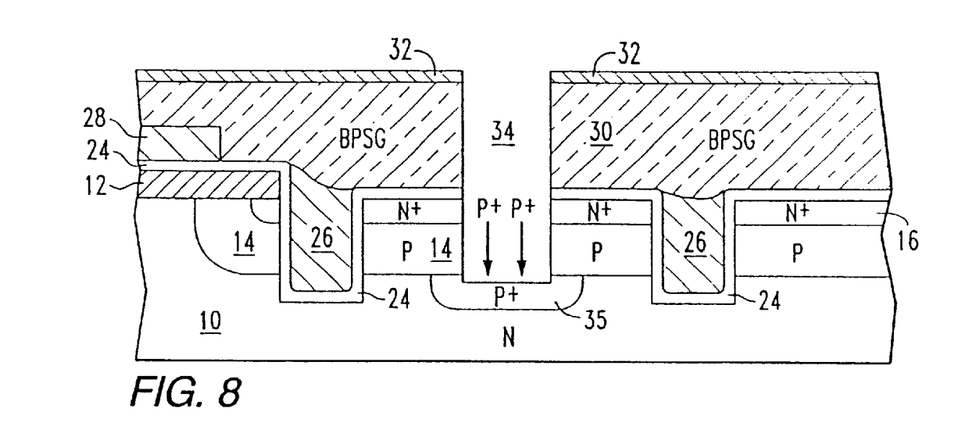

A layer of borophosphosilicate glass ("BPSG") 30 may then be formed over the surface of the semiconductor as shown in FIG. 7, and, as shown in FIG. 8, a fourth mask 32 may be conventionally formed over the BPSG layer 30 to thereby define a the area for a third trench 34 which may be etched through the BPSG layer 30, the gate oxide 24, the N+ source 16, and the P channel area 14 into the N semiconductor 10. Once the trench 34 has been etched, a P type impurity may be implanted and driven into the N wafer to thereby form a P+ area 35 of higher impurity concentration than the P channel region 14.

Figure 9:
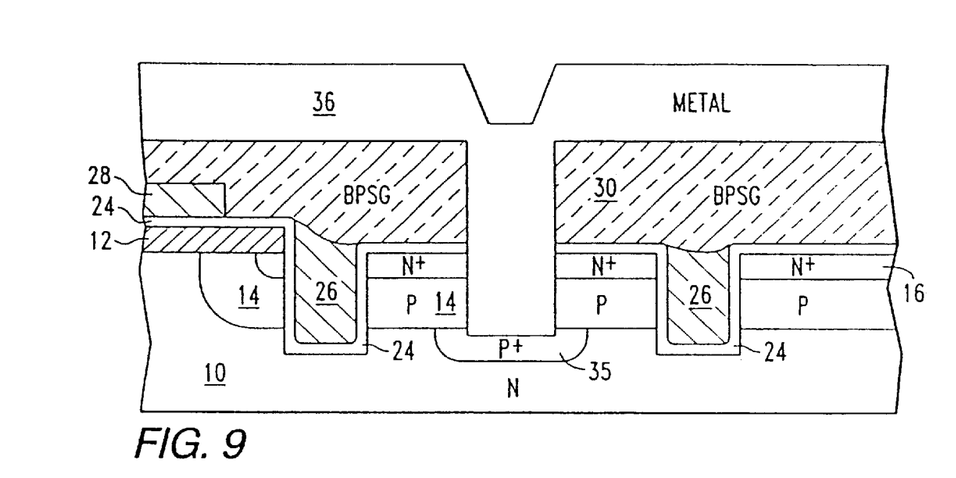

As illustrated in FIG. 9, a metal layer 36 may then be formed over both the BPSG area 30 to thereby establish a contact with the N+ source region and the P+ high concentration region 35 at the bottom of the trench 34 of FIG. 8.

The four mask trench process of the present invention eliminates two masks used in the prior art process, i.e., the P+ mask and the source block mask, and it makes alignment easier to achieve, i.e., the only alignment required is the contact to the trench.

Figure 10:
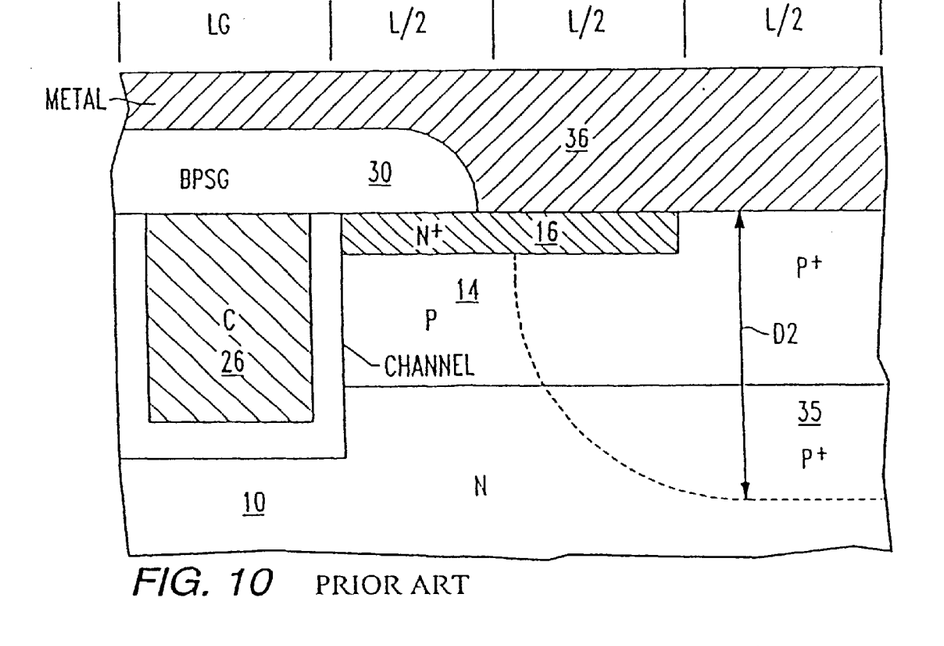
FIG. 10 illustrates the structure which results from the conventional trench process.

The six mask process of the prior art process results in a structure as shown in FIG. 10 and provides a ready contrast with the structure of the present trench process.

In the prior art structure of FIG. 10, the cell pitch is equal to the length of the gate ("LG") plus three time the length of the design rule value ("L") and the width of the source is equal to L.

Figure 11:
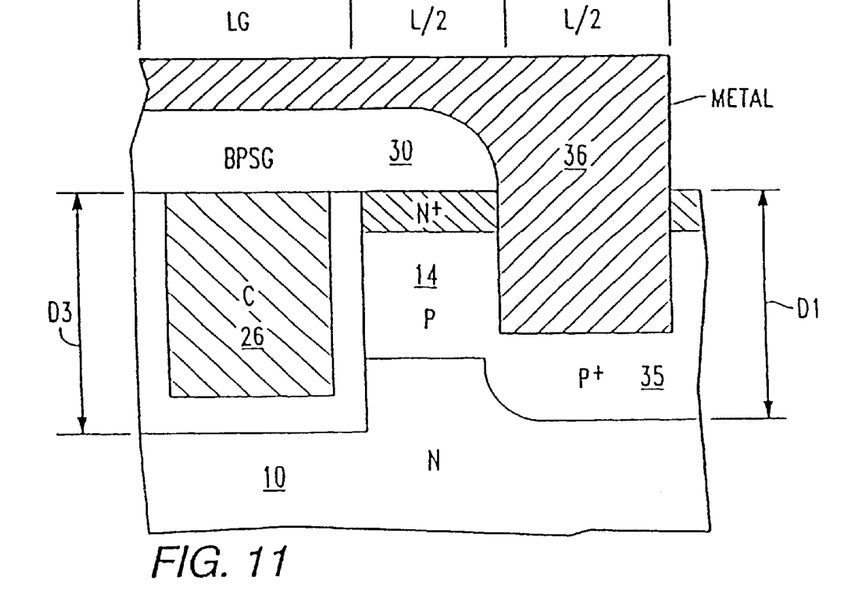
FIG. 11 illustrates the novel structure which results from the trench process of the present invention.
Figures 12, 13:
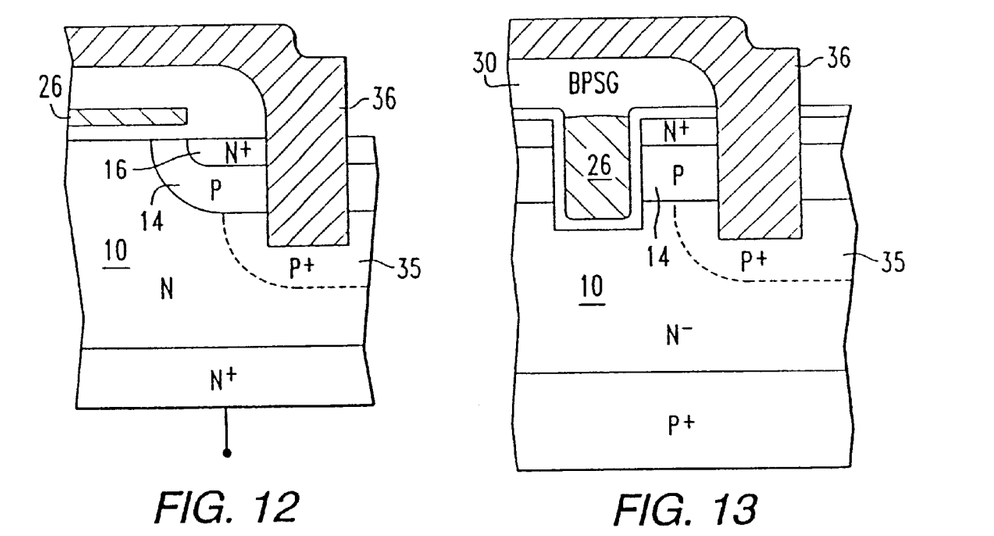
FIG. 12 illustrates the novel structure of the present invention embodied in a planar MOSFET.
FIG. 13 illustrates the novel structure of the present invention embodied in a trench insulated gate bipolar transistor ("IGBT").
Figure 14:
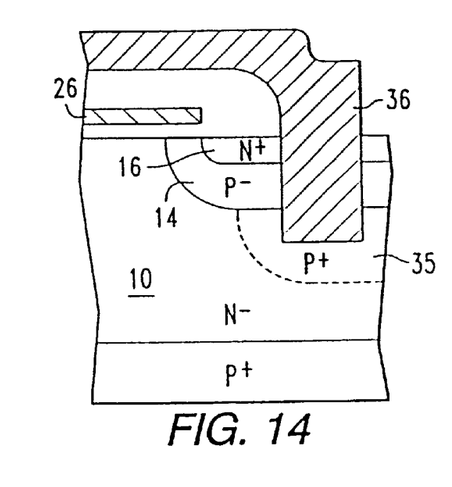
FIG. 14 illustrates the novel structure of the present invention embodied in a planar IGBT.

In contrast, the structure of FIG. 11 provides a cell pitch of LG plus 2L, a saving of L and the width of the source is reduced to L/2. In addition, the depth D1 of the P+ high concentration area or buried layer 35 may be significantly reduced below the depth D2 in FIG. 10 because the depth D2 is necessitated to achieve the lateral diffusion of the P+ implant under the source 16. Because of the impact of the lateral diffusion on the channel 14, the length of the source, and thus the design rule value L, negatively impacts on the pitch of the device. Because the length of the source 16 is reduced in FIG. 11, it is possible to reduce the design rule value L and the pitch.

Additionally, the depth D1 of the buried layer 35 in FIG. 11 may be greater than the depth D3 of the trench gates 20, 22, making it possible for the MOSFET to break down at the PN junction 35 and protect the trench gate 20, 22.

Figure 15:
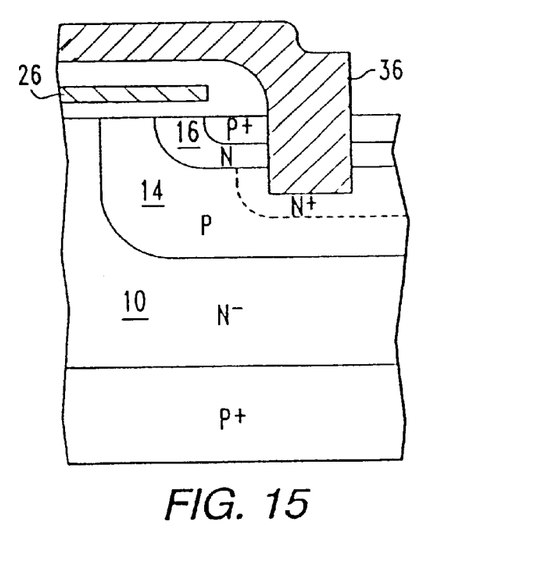
FIG. 15 illustrates the novel structure of the present invention embodied in a planar MCT.

With reference to FIGS. 12–15 in which like numerical references have been retained with the structures of FIGS. 10 and 11 to facilitate a comparison therewith, the present invention may be embodied in a planar MOSFET (FIG. 12), a trench IGBT (FIG. 13), a planar IGBT (FIG. 14) and a planar MCT (FIG. 15).

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

EXHIBIT A

| Pat # | Apt # | Status | Country | Title |
|---|---|---|---|---|
| 4975751 | 253437 | Granted | US | HIGH BREAKDOWN ACTIVE DEVICE STRUCTURE WITH LOW SERIES RESISTANCE |
| 5091336 | 07/592308 | Granted | US | HIGH BREAKDOWN ACTIVE DEVICE STRUCTURE WITH LOW SERIES RESISTANCE |
| 4651179 | 749091 | Granted | US | LOW RESISTANCE GALLIUM ARSENIDE FIELD EFFECT TRANSISTOR |
| 4750666 | 853255 | Granted | US | METHOD OF FABRICATING GOLD BUMPS ON IC'S AND POWER CHIPS |
| 4441117 | 287497 | Granted | US | MONOLITHICALLY MERGED FET AND BIPOLAR JUNCTION TRANSISTOR |
| 4749886 | 916869 | Granted | US | REDUCED PARALLEL EXCLUSIVE OR AND EXCLUSIVE NOR GATE |
| 4857977 | 88353 | Granted | US | LATERAL METAL-OXIDE-SEMICONDUCTOR CONTROLLED TRIACS |
| 4847671 | 51424 | Granted | US | MONOLITHICALLY INTEGRATED INSULATED GATE SEMICONDUCTOR DEVICE |
| 4980740 | 329034 | Granted | US | MOS-PILOT STRUCTURE FOR INSULATED GATE TRANSISTOR |
| 4985740 | 359811 | Granted | US | RESISTANCE |
| 4901127 | 254897 | Granted | US | CIRCUIT INCLUDING A COMBINED INSULATED GATE BIPOLAR TRANSISTOR MOSFET |
| 4933740 | 243211 | Granted | US | INSULATED GATE TRANSISTOR WITH VERTICAL INTEGRAL DIODE AND METHOD OF FABRICATION |
| 4561008 | 870484 | Granted | US | BALLASTED, GATE CONTROLLED SEMICONDUCTOR DEVICE |
| 4532534 | 415486 | Granted | US | MOSFET WITH PERIMETER CHANNEL |
| 4631564 | 664027 | Granted | US | GATE SHIELD STRUCTURE FOR POWER MOS DEVICE |
| 4684413 | 784726 | Granted | US | METHOD FOR INCREASING THE SWITCH SPEED OF A SEMI DEVICE BY NEUTRON IRRADIATION |
| 4901135 | 232197 | Granted | US | HERMETICALLY SEALED HOUSING WITH WELDING SEAL |
| 5095343 | 07/609054 | Granted | US | POWER MOSFET |
| 5023692 | 447330 | Granted | US | POWER MOSFET TRANSISTOR CIRCUIT |
| 5079608 | 07/609685 | Granted | US | POWER MOSFET TRANSISTOR CIRCUIT WITH ACTIVE CLAMP |
| 5148264 | 07/517799 | Granted | US | HIGH CURRENT HERMETIC PACKAGE |
| 5038197 | 545218 | Granted | US | HERMETICALLY SEALED DIE PACKAGE WITH FLOATING SOURCE |
| 4427993 | 209001 | Granted | US | THERMAL STRESS RELIEVING BIMETALLIC PLATE |
| 4700460 | 924865 | Granted | US | BIDIRECTIONAL VERTICAL POWER MOS DEVICE AND FABRICATION METHOD |
| 4644637 | 567116 | Granted | US | INSULATED GATE SEMICONDUCTOR DEVICE WITH IMPROVED SHORTING REGION AND METHOD OF MAKING |
| 4743952 | 482075 | Granted | US | RESISTANCE |
| 4646117 | 678530 | Granted | US | POWER SEMICONDUCTOR DEVICES WITH INCREASED TURN-OFF CURRENT RATINGS |
| 4904609 | 190903 | Granted | US | SYMMETRICAL BLOCKING HIGH VOLTAGE BREAKDOWN SEMICONDUCTOR DEVICE AND METHOD OF FABRICATION |
| 4783690 | 892739 | Granted | US | POWER SEMICONDUCTOR DEVICE WITH MAIN CURRENT SECTION AND EMULATION CURRENT SECTION |
| 4982258 | 188888 | Granted | US | METAL OXIDE SEMICONDUCTOR GATED TURN-OFF THYRISTOR INCLUDIN |
|  | 08/310041 | Pending | US | FET, IGBT AND MCT STRUCTURES TO ENHANCE OPERATING CHARACTER |
| 4903189 | 186983 | Granted | US | LOW NOISE, HIGH FREQUENCY SYNCHRONOUS RECTIFIER |
| 4641164 | 868633 | Granted | US | MET |
| 4581626 | 28576 | Granted | US | INSULATED GATE TURNOFF THYRISTORS AND TRANSISTORS |
| 4500609 | 245764 | Granted | US | METHOD FOR PRODUCING EUTECTICS AS THIN FILMS |
| 4341594 | 238726 | Granted | US | METHOD OF RESTORING SEMICONDUCTOR DEVICE PERFORMANCE |
| 4417385 | 406731 | Granted | US | SELF ALIGNED, MINIMUM MASK PROC FOR MFG INSULATED GATE SEMI DEVICES WITH INTEGRAL SHORTS |
| 4663547 | 257080 | Granted | US | COMPOSITE CIRCUIT FOR POWER SEMICONDUCTOR SWITCHING |
| 4980741 | 308498 | Granted | US | MOS PROTECTION DEVICE |
| 4506282 | 455174 | Granted | US | NORMALLY OFF SEMICONDUCTOR DEVICE WITH LOW ON-RESISTANCE AN |
| 4641174 | 510520 | Granted | US | PINCH RECTIFIER |
| 4500898 | 395761 | Granted | US | EUTECTIC |
| 4443931 | 392870 | Granted | US | METHOD OF FABRICATING A SEMICONDUCTOR DEVICE WITH A BASE REGION HAVING A DEEP PORTION |
| 4430792 | 406738 | Granted | US | SELF ALIGNED MINIMAL MASK PROCESS EMPLOY 2-STEP ETCH FOR MFG INSUL GATE SEMICONDUCTORS |
| 4523111 | 473089 | Granted | US | NORMALLY-OFF, GATE-CONTROLLED ELECTRICAL CIRCUIT WITH LOW ON-RESISTANCE |
| 4739387 | 497339 | Granted | US | SCR HAVING HIGH GATE SENSITIVITY AND HIGH DV/DT RATING |

-continued

EXHIBIT A

| Pat # | Apt # | Status | Country | Title |
|---|---|---|---|---|
| 4466176 | 502834 | Granted | US | SELF ALIGNED MINIMAL MASK PROCESS FOR MFG INSULATED GATE SEMI DEVICES WITH INTEGRAL SHORTS |
| 4571815 | 650315 | Granted | US | VERTICAL CHANNEL FIELD CONTROLLED DEVICE EMPLOYING A RECESS |
| 4967243 | 221482 | Granted | US | POWER TRANSISTOR STRUCTURE WITH HIGH SPEED INTEGRAL ANTIPAR |
| 4969027 | 220649 | Granted | US | POWER BIPOLAR TRANSISTOR DEVICE WITH INTEGRAL ANTISATURATION DIODE |
| 4821095 | 25036 | Granted | US | INSULATED GATE SEMICONDUCTOR DEVICE WITH EXTRA SHORT GRID AND METHOD OF FABRICATION |
| 4645957 | 685632 | Granted | US | NORMALLY OFF SEMICONDUCTOR DEVICE WITH LOW ON-RESISTANCE AND CIRCUIT ANALOGUE |
| 4598461 | 693643 | Granted | US | SELF ALIGNED POWER MOSFET WITH INTERGRAL SOURCE-BASE SHORT AND METHODS FOR MAKING |
| 4587712 | 692073 | Granted | US | VERTICAL CHANNEL FIELD CONTROLLED DEVICE EMPLOYING A RECESSED GATE STRUCTURE AND METHOD FOR MAKING |
| 4656493 | 698498 | Granted | US | BIDIRECTIONAL HIGH SPEED POWER MOSFET DEVICES WITH DEEP LEVEL RECOMBINATION CENSORS IN BASE REGION |
| 4937644 | 756478 | Granted | US | ASYMMETRICAL FIELD CONTROLLED THYRISTOR |
| 4823176 | 33952 | Granted | US | (VDMOS) DEVICE INCL HI VOLT JUNCTION EXHIB INCREASE SAFE OP AREA |
| 4801986 | 33940 | Granted | US | VERTICAL DOUBLE DIFFUSED METAL OXIDE SEMI (VDMOS) DEVICE WITH INCREASED SAFE OP AREA AND METHOD |
| 4720308 | 843346 | Granted | US | METHOD FOR PRODUCING HIGH ASPECT RATIO HOLLOW DIFFUSED REGI |
| 4816422 | 947151 | Granted | US | FABRICATION OF LARGE POWER SEMICONDUCTOR COMPOSITE BY WAFER INTERCONNECTION OF INDIVIDUAL DEVICES |
| 4801985 | 51359 | Granted | US | IMPROVED MONLITHICALLY INTEGRATED SEMICONDUCTOR DEVICE AND PROCESS FOR FABRICATION |
| 4769744 | 851275 | Granted | US | SEMICONDUCTOR CHIP PACKAGES HAVING SOLDER LAYERS OF ENHANCED DURABILITY |
| 4890143 | 225320 | Granted | US | PROTECTIVE CLAMP FOR MOS GATED DEVICES |
| 4857983 | 51430 | Granted | US | MONOLITHICALLY INTEGRATED SEMICONDUCTOR DEVICE HAVING REVERSES CONDUCTING CAPAB & METHOD OF FABRICATION |
| 4646129 | 872792 | Granted | US | HERMETIC POWER CHIP PACKAGES |
| 4799095 | 69806 | Granted | US | METAL OXIDE SEMICONDUCTOR GATED TURN OFF THYRISTOR |
| 4939101 | 240332 | Granted | US | DIRECT-BONDED WAFERS HAVING A VOID FREE INTERFACE AND METHOD OF FABRICATION |
| 4837606 | 14196 | Granted | US | VERTICAL MOSFET WITH REDUCED BIPOLAR EFFECTS |
| 4782379 | 40693 | Granted | US | SEMICONDUCTOR DEVICE HAVING RAPID REMOVAL OF MAJORITY CARRI |
| 4816892 | 36058 | Granted | US | SEMICONDUCTOR DEVICE HAVING TURN-ON AND TURN-OFF CAPABILITIES |
| 4809047 | 98756 | Granted | US | INSULATED-GATE SEMICONDUCTOR DEVICE WITH IMPROVED BASE-TO SOURCE ELECTRODE SHORT & METHOD OF FAB SAID SHORT |
| 4883767 | 220353 | Granted | US | METHOD OF FABRICATING SELF-ALIGNED SEMICONDUCTOR DEVICES |
| 4677452 | 767052 | Granted | US | POWER FIELD-EFFECT TRANSISTOR STRUCTURES |
| 4597822 | 717364 | Granted | US | METHOD FOR MAKING SILICON WAFERS |
| 4505029 | 501745 | Granted | US | SEMICONDUCTOR DEVICE WITH BUILT UP LOW RESISTANCE CONTACT |
| 4809045 | 781381 | Granted | US | INSULATED GATE DEVICE |
| 4682195 | 781383 | Granted | US | IMPROVED INSULATED GATE DEVICE |
| 4641162 | 807597 | Granted | US | CURRENT LIMITED INSULATED GATE DEVICE |
| 4794432 | 7034 | Granted | US | MOSFET STRUCTURE WITH SUBSTRATE COUPLED SOURCE |
| 4803533 | 913785 | Granted | US | IGT AND MOSFET DEVICES HAVING REDUCED CHANNEL WIDTH |
| 4810665 | 77711 | Granted | US | SEMCONDUCTOR DEVICE AND METHOD OF FABRICATION |
| 4860080 | 32367 | Granted | US | IMPROVED ISOLATION FOR TRANSISTOR DEVICES HAVING A PILOT STRUCTURE |
| 4345266 | 236220 | Granted | US | TRANSISTOR HAVING IMPROVED TURN OFF TIME AND SECOND BREAKDOWN CHARACERISTICS |
| 4999684 | 07/435632 | Granted | US | SYMMETRICAL BLOCKING HI VOLTAGE BREAKDOWN SEMI DEVICE AND METHOD OF FABRICATION |
| 5041896 | 07/376073 | Granted | US | SYMMETRICAL BLOCKING HIGH VOLTAGE SEMICONDUCTOR DEVICE AND METHOD OF FABRICATION |
| 4941026 | 07/239014 | Granted | US | SEMICONDUCTOR DEVICES EXHIBITING MINIMUM ON RESISTANCE |
| 5082795 | 267757 | Granted | US | METHOD OF FABRICATING A FIELD EFFECT SEMICONDUCTOR DEVICE HAVING A SELF ALIGNED STRUCTURE |
| 5018002 | 07/375641 | Granted | US | HI CURRENT HERMETIC PACKAGE INCL AN INTERNAL FOIL AND HAVING A LEAD EXTENDING THROUGH THE PACK LID AND PACK CHIP |
| 5164802 | 07/672243 | Granted | US | POWER VDMOSFET WITH SCHOTTKY ON LIGHTLY DOPED DRAIN OF LATERAL DRIVER FET |
| 5097319 | 07/672997 | Granted | US | COVER WITH THROUGH TERMINALS FOR A HERMETICALLY SEALED ELECTRONIC PACKAGE |
| 4969028 | 07/492377 | Granted | US | GATE ENHANCED RECTIFIER |
| 4937467 | 411424 | Granted | US | COMPLEMENTARY CIRCUIT AND STRUCTURE WITH COMMON SUBSTRATE |

-continued

EXHIBIT A

| Pat # | Apt # | Status | Country | Title |
|---|---|---|---|---|
| 4460913 | 316660 | Granted | US | FAST SWITCHING TRANSISTOR |
| 4420765 | 268284 | Granted | US | MULTI-LAYER PASSIVANT SYSTEM |
| 4374455 | 351250 | Granted | US | METHOD FOR MANUFACTURING A VERTICAL, GROOVED MOSFE |
| 4455565 | 234834 | Granted | US | VERTICAL MOSFET WITH AN ALIGNED GATE ELECTRODE AND |
| 4433008 | 377197 | Granted | US | DOPED-OXIDE DIFFUSION OF PHOSPHORUS USING BOROPHOS |
| 4344985 | 248208 | Granted | US | METHOD OF PASSIVATING A SEMICONDUCTOR DEVICE WITH |
| 4586240 | 748940 | Granted | US | VERTICAL IGFET WITH INTERNAL GATE AND METHOD FOR MAKING SAME |
| 4549926 | 553305 | Granted | US | METHOD FOR GROWING MONOCRYSTALLINE SILICON ON A MA |
| 4578142 | 608544 | Granted | US | METHOD FOR GROWING MONOCRYSTALLINE SILICON THROUGH |
| 4639762 | 605427 | Granted | US | MOSFET WITH REDUCED BIPOLAR EFFECTS |
| 4605948 | 637027 | Granted | US | SEMICONDUCTOR STRUCTURE FOR ELECTRIC FIELD DISTRIBUTION |
| 4584028 | 653559 | Granted | US | NEUTRALIZATION OF ACCEPTOR LEVELS IN SILICON BY AT |
| 4639754 | 705371 | Granted | US | VERTICAL MOSFET WITH DIMINISHED BIPOLAR EFFECTS |
| 4661199 | 797126 | Granted | US | METHOD TO INHIBIT AUTODOPING IN EPITAXIAL LAYERS |
| 4910563 | 232243 | Granted | US | COMPLEMENTARY CIRCUIT AND STRUCTURE WITH COMMON SUBSTRATE |
| 5243211 | 07/797054 | Granted | US | MOSFET WITH SHIELDED CHANNEL |
| 5323036 | 07/822732 | Granted | US | ATOMIC LATICED LAYOUT |
| 5218220 | 07/789901 | Granted | US | POWER FET HAVING REDUCED THRESHOLD VOLTAGE |
| 4994883 | 07/416171 | Granted | US | FIELD CONTROLLED DIODE (FCD) HAVING MOS TRENCH GATES |
| 5293070 | 07/973603 | Granted | US | INTEGRATED HEAT SINK FOR SEMICONDUCTOR MODULES |
| 5422288 | 08/246307 | Granted | US | METHOD OF DOPING A JFET REGION IN A MOS-GATED SEMICONDUCTOR DEVICE |
| 5463344 | 08/051839 | Granted | US | FAST TURN ON SWITCH CIRCUIT WITH PARALLEL MOS CONTROLLED THYRISTOR AND SILICON CONTROLLED THYRISTOR AND SILICON CONTROLLED RECTIFIER |
| 5366932 | 51832 | Granted | US | SEMICONDUCTOR CHIP HAVING INTERDIGITATED GATE RUNNERS WITh GATE BONDING PADS |
| 5497013 | 08/276464 | Granted | US | SEMICONDUCTOR CHIP HAVING INTERDIGITATED GATE RUNNERS WITH GATE BONDING PADS |
| 5317184 | 07/973709 | Granted | US | DEVICE AND METHOD FOR IMPROVING CURRENT CARRYING CAPABILITY IN A SEMICONDUCTOR DEVICE |
| 5455442 | 08/375714 | Granted | US | COMFET SWITCH AND METHOD |
| 5594261 | 08/223425 | Granted | US | METHOD AND DEVICE FOR ISOLATING PARALLEL SUB-ELEMENTS WITH REVERSE CONDUCTING DIODE REGIONS |
| 5424563 | 08/173077 | Granted | US | APPARATUS AND METHOD FOR INCREASING BREAKDOWN VOLTAGE RUGGEDNESS IN SEMICONDUCTOR DEVICES |
| 5399892 | 08/158444 | Granted | US | METHOO OF FORMING MOS-GATED SEMICONDUCTOR DEVICES HAVING MESH GEOMETRY PATTERN |
| 5468668 | 08/368612 | Granted | US | METHOD OF FORMING MOS-GATED SEMICONDUCTOR DEVICES HAVING MESH GEOMETRY PATTERN |
| 5654226 | 08/305435 | Granted | US | WAFER BONDING FOR POWER DEVICES |
| 5880513 | 08/634371 | Granted | US | ASYMMETRIC SNUBBER RESISTOR |
|  | 08/494394 | Pending | US | MEGASONIC PLL POWER GENERATOR |
| 5789982 | 08/712562 | Granted | US | LOW DISTORTION FEEDBACK IC AMPLIFIER AND METHOD |
| 5694417 | 08/509590 | Granted | US | SHORT BURST DIRECT ACQUISITION DIRECT SEQUENCE SPREAD SPECTRUM RECEIVER |
| 5770878 | 08/636904 | Granted | US | TRENCH MOS GATE DEVICE |
|  | 09/096217 | Pending | US | TRENCH MOS GATE DEVICE |
| 5913130 | 08/662118 | Granted | US | METHOD FOR FABRICATING A POWER DEVICE |
| 6078077 | 09/330437 | Granted | US | METHOD FOR FABRICATING A POWER DEVICE |
|  | 09/542561 | Pending | US | METHOD FOR FABRICATING A POWER DEVICE |
|  | 09/358625 | Pending | US | DOUBLY GRADED JUNCTION TERMINATION EXTENSION (JTE) FOR EDGE PASSIVATION OF SEMICONDUCTOR DEVICES |
|  | 09/098517 | Pending | US | HIGH PERFORMANCE HEAT EXCHANGER AND METHOD |
|  | 09/570009 | Pending | US | HIGH PERFORMANCE HEAT EXCHANGER AND METHOD |
| 6110799 | 08/885879 | Granted | US | A NOVEL TRENCH MOSFET PROCESS |
| 6037628 | 08/885922 | Granted | US | A NOVEL TRENCH MOSFET PROCESS |
|  | 09/498476 | Pending | US | A NOVEL TRENCH MOSFET PROCESS |
| 5872028 | 08/708712 | Granted | US | METHOD OF FORMING POWER SEMICONDUCTOR DEVICES WITH CONTROLLABLE INTEGRATED BUFFER |
| 6110763 | 08/861562 | Granted | US | ONE MASK POWER SEMICONDUCTOR FABRICATION PROCESS |
| 5940689 | 08/885921 | Granted | US | METHOD OF FABRICATING UMOS SEMICONDUCTOR DEVICES USING A SELF-ALIGNED, REDUCED MASK PROCESS |
| 6054369 | 08/885878 | Granted | US | IMPROVED LIFETIME CONTROL FOR SEMICONDUCTOR DEVICES |
| 5894141 | 08/885227 | Granted | US | BIPOLAR SEMICONDUCTOR POWER CONTROLLING DEVICES WITH HETEROJUNCTION |
|  | 08/885228 | Pending | US | SEMICONDUCTOR DEVICE GATE STRUCTURE FOR THERMAL OVERLOAD PROTECTION |
|  | 09/338891 | Pending | US | SEMICONDUCTOR DEVICE GATE STRUCTURE FOR THERMAL OVERLOAD PROTECTION |
| 6081009 | 08/966867 | Granted | US | HIGH VOLTAGE MOSFET STRUCTURE |
| 6066878 | 09/108962 | Granted | US | HIGH VOLTAGE MOSFET STRUCTURE |
| 5877041 | 08/884726 | Granted | US | CARBIDE |

-continued

EXHIBIT A

| Pat # | Apt # | Status | Country | Title |
|---|---|---|---|---|
| 5877044 | 08/814842 | Granted | US | METHOD OF MAKING MOS-GATED SEMICONDUCTOR DEVICES |
| 5970343 | 08/133030 | Granted | US | FABRICATION OF CONDUCTIVITY ENHANCED MOS-GATED SEMICONDUCTOR DEVICES |
| | 09/114769 | Pending | US | CONDUCTIVITY ENHANCED MOS-GATED SEMICONDUCTOR DEVICES |
| 6188575 | 09/107273 | Granted | US | HEAT EXCHANGING CHASSIS AND METHOD |
| | 09/649815 | Pending | US | HEAT EXCHANGING CHASSIS AND METHOD |
| | 09/649837 | Pending | us | HEAT EXCHANGING CHASSIS AND METHOD |
| 5920452 | 09/088198 | Granted | US | CIRCUIT AND METHOD FOR PROTECTING FROM OVERCURRENT CONDITIONS AND DETECTING AN OPEN ELECTRICAL LOAD |
| | 09/350575 | Pending | US | PROCESS FOR FORMING VERTICAL SEMICONDUCTOR DEVICE HAVING INCREASED SOURCE CONTACT AREA |
| 6069403 | 09/167203 | Granted | US | POWER MODULE WITH LOWERED INDUCTANCE AND REDUCED VOLTAGE OVERSHOOTS |
| 6140152 | 09/334098 | Granted | US | POWER MODULE WITH LOWERED INDUCTANCE AND REDUCED VOLTAGE OVERSHOOTS |
| 6107127 | 09/145513 | Granted | US | METHOD OF MAKING SHALLOW WELL MOSFET STRUCTURE |
| 6055149 | 09/203700 | Granted | US | CURRENT LIMITED, THERMALLY PROTECTED, POWER DEVICE |
| | 09/167177 | Pending | US | PROCESS FOR FORMING HIGH VOLTAGE JUNCTION TERMINATION EXTENSION OXIDE |
| | 09/307879 | Pending | US | PROCESS FOR FORMING MOS-GATED DEVICES HAVING SELF-ALIGNED TRENCHES |
| 6121089 | 09/092334 | Granted | US | METHODS OF FORMING POWER SEMICONDUCTOR DEVICES HAVING MERGED SPLIT-WELL BODY REGIONS THEREIN AND DEVICES FORMED THEREBY |
| | 09/344867 | Pending | US | POTTED TRANSDUCER ARRAY WITH MATCHING NETWORK IN A MULTIPLE PASS CONFIGURATION |
| | 09/663235 | Pending | US | POTTED TRANSDUCER ARRAY WITH MATCHING NETWORK IN A MULTIPLE PASS CONFIGURATION |
| 6077744 | 09/255092 | Granted | US | SEMICONDUCTOR TRENCH MOS DEVICES |
| | 09/037723 | Pending | US | METHODS FOR MAKING SEMICONDUCTOR DEVICES BY LOW TEMPERATURE DIRECT BONDING |
| | 09/296472 | Pending | US | FAST TURN-OFF POWER SEMICONDUCTOR DEVICES |
| 6153495 | 09/036815 | Granted | US | ADVANCED METHODS FOR MAKING SEMICONDUCTOR DEVICES BY LOW TEMPERATURE DIRECT BONDING |
| | 09/036838 | Pending | US | DEVICES FORMABLE BY LOW TEMPERATURE DIRECT BONDING |
| 6137139 | 09/324553 | Granted | US | LOW VOLTAGE DUAL-WELL MOS DEVICE HAVING HIGH RUGGEDNESS, LOW ON-RESISTANCE, AND IMPROVED BODY DIODE REVERSE RECOVERY |
| 6104062 | 09/107721 | Granted | US | SEMICONDUCTOR DEVICE HAVING REDUCED EFFECTIVE SUBSTRATE RESISTIVITY AND ASSOCIATED METHODS |
| | 09/551187 | Pending | US | SEMICONDUCTOR DEVICE HAVING REDUCED EFFECTIVE SUBSTRATE RESISTIVIY AND ASSOCIATED METHODS |
| 6162702 | 09/334835 | Granted | US | SELF-SUPPORTING ULTRATHIN SILICON WAFER PROCESS |
| | 09/303270 | Pending | US | POWER MOS DEVICE WITH INCREASED CHANNEL WIDTH AND PROCESS FOR FORMING SAME |
| | 09/765177 | Pending | US | POWER MOS DEVICE WITH INCREASED CHANNEL WIDTH AND PROCESS FOR FORMING SAME |
| | 09/450872 | Pending | US | EMITTER BALLAST RESISTOR WITH ENHANCED BODY EFFECT TO IMPROVE THE SHORT CIRCUIT WITHSTAND CAPABILITY OF POWER DEVICES |
| | 09/339356 | Pending | US | BACKMETAL DRAIN TERMINAL WITH LOW STRESS AND THERMAL RESISTANCE |
| 6188105 | 09/283531 | Granted | US | HIGH DENSITY MOS-GATED POWER DEVICE AND PROCESS FOR FORMING SAME |
| | 09/260411 | Pending | US | MOS-GATED DEVICE HAVING A BURIED GATE AND PROCESS FOR FORMING SAME |
| | 09/318334 | Pending | US | TRENCH-GATED DEVICE HAVING TRENCH WALLS FORMED BY SElECTIVE EPITAXIAL GROWTH AND PROCESS FOR FORMING DEVICE |
| | 09/314323 | Pending | US | MOS-GATED POWER DEVICE HAVING EXTENDED TRENCH AND DOPING ZONE AND PROCESS FOR FORMING SAME |
| | 09/726682 | Pending | US | MOS-GATED POWER DEVICE HAVING EXTENDED TRENCH AND DOPING ZONE AND PROCESS FOR FORMING SAME |
| | 09/345930 | Pending | US | POWER SEMICONDUCTOR MOUNTING PACKAGE CONTAINING BALL GRID ARRAY |
| | 09/525182 | Pending | US | POWER TRENCH TRANSISTOR DEVICE SOURCE REGION FORMATION USING SILICON SPACER |
| | 09/624533 | Pending | US | POWER MOS DEVICE WITH BURIED GATE |
| | 09/654845 | Pending | US | POWER SEMICONDUCTOR DEVICE WITH HIGH AVALANCHE CAPABILITY |
| | 09/718219 | Pending | US | PROCESS FOR CONTROLLING LIFETIME IN A P-I-N DIODE AND FOR FORMING DIODE WITH IMPROVED LIFETIME CONTROL |
| | 09/689939 | Pending | US | MOS-GATED POWER DEVICE HAVING SEGMENTED TRENCH AND EXTENDED DOPING ZONE AND PROCESS FOR FORMING SAME |
| | 09/502712 | Pending | US | MOS-GATED DEVICE HAVING ALTERNATING ZONES OF CONDUCTIVITY |
| | 09/665,850 | Pending | US | SELF-ALIGNED PROCESS FOR FABRICATING POWER MOSFET WITH SPACER-SHAPED TERRACED GATE |

-continued

EXHIBIT A

| Pat # | Apt # | Status | Country | Title |
|---|---|---|---|---|
| | 09/603605 | Pending | US | SOFT RECOVERY POWER DIODE AND RELATED METHOD |
| | 60/198692 | Pending | US | QUASI-RESONANT CONVERTER |
| | 09/664024 | Pending | US | INTEGRATED CIRCUIT DEVICE INCLUDING A DEEP WELL REGION AND ASSOCIATED METHODS |
| | 60/219858 | Pending | US | PRODUCED BY USING A FULLY SELF-ALIGNED BODY IMPLANT PROCESS |
| 4994871 | 07/279392 | Granted | US | INSULATED GATE BIPOLAR TRANSISTOR WITH IMPROVED LATCHUP CURRENT LEVEL AND SAFE OPERATING AREA |
| 5134321 | 07/644569 | Granted | US | POWER MOSFET AC POWER SWITCH EMPLOYING MEANS FOR PREVENTING CONDUCTION OF BODY DIODE |
| 4634473 | 773772 | Granted | US | METHOD FOR FABRICATING A RADIATION HARDENED OXIDE HAVING STRUCTURAL DAMAGE |
| 4998151 | 337684 | Granted | US | POWER FIELD EFFECT DEVICES HAVING SMALL CELL SIZE AND LOW CONTACT RESISTANCE AND METHOD OF FABRICATION |
| 4587713 | 582601 | Granted | US | METHOD FOR MAKING VERTICAL MOSFET WITH REDUCED BIPOLAR EFFECTS |
| 4648174 | 698495 | Granted | US | METHOD OF MAKING HIGH BREAKDOWN VOLTAGE SEMICONDUCTOR DEVICE |
| 4927772 | 358057 | Granted | US | HIGH BREAKDOWN VOLTAGE SEMICONDUCTOR DEVICE AND METHOD OF FABRICATION |
| 4675978 | 773771 | Granted | US | METHOD FOR FABRICATING A RADIATION HARDENED OXIDE |
| 6080614 | 08/885877 | Granted | US | METHOD OF MAKING A MOS-GATED SEMICONDUCTOR DEVICE WITH A SINGLE DIFFUSION |
| | 09/449487 | Pending | US | METHOD OF MAKING A MOS-GATED SEMICONDUCTOR DEVICE WITH A SINGLE DIFFUSION |
| | 60/234563 | Pending | US | CONTROLLING SILICON TRENCH PROFILES BY INCREMENTAL INCREASES IN OXYGEN FLOWS |
| 5103290 | 07/367525 | Granted | US | HERMETIC PACKAGE HAVING A LEAD EXTENDING THROUGH AN APERTURE IN THE PACKAGE LID AND PACKAGED SEMICONDUCTOR CHIP |
| 5446316 | 08/217801 | Granted | US | METHOD OF PACKAGING A SEMICONDUCTOR DEVICE |
| 5577656 | 08/462856 | Granted | US | METHOD OF PACKAGING A SEMICONDUCTOR DEVICE |
| 5473193 | 08/177974 | Granted | US | PACKAGE FOR PARALLEL SUBELEMENT SEMICONDUCTOR DEVICES |
| | 08/759865 | Pending | US | A METHOD OF METALIZING A SEMICONDUCTOR POWER DEVICE CERAMIC MEMBER |
| 5995349 | 08/944513 | Granted | US | PROTECTION DEVICE FOR SOLID STATE SWITCHED POWER ELECTRONICS |
| 6060795 | 09/040112 | Granted | US | SEMICONDUCTOR POWER PACK |
| 4545109 | 459756 | Granted | US | METHOD OF MAKING A GALLIUM ARSENIDE FIELD EFFECT TRANSISTOR |
| 4516143 | 579229 | Granted | US | SELF-ALIGNED POWER MOSFET WITH INTEGRAL SOURCE BASE SHORT A |
| 4567641 | 650314 | Granted | US | METHOD OF FABRICATING SEMI-CONDUCTOR DEVICE HAVING A DIFFUSED REGION OF REDUCED LENGTH |
| | 449321 | Pending | US | LATERAL INSULATED GATE RECTIFIER STRUCTURES |
| | 449322 | Pending | US | BIDIRECTIONAL INSULATED GATE RECTIFIER STRUCTURES AND METHOD |
| | 464161 | Granted | US | BIDIRECTIONAL INSULATED GATE RECTIFIER STRUCTURES AND METHOD |
| 4862242 | 807612 | Granted | US | SEMICONDUCTOR WAFER WITH AN ELECTRICALLY ISOLATED SEMICONDUCTOR |
| | 726749 | Pending | US | INSULATED GATE SEMICONDUCTOR DEVICE |
| 4516143 | 579229 | Granted | US | SELF-ALIGNED POWER MOSFET WITH INTEGRAL SOURCE-BASE SHORT AND METHODS OF MAKING |
| 4595428 | 567708 | Granted | US | METHOD FOR PRODUCING HIGH ASPECT RATIO HOLLOW DIFFUSED REGIONS IN A SEMICON-DUCTOR BODY AND DIODE PRODUCED THEREBY |
| 4546375 | 439563 | Granted | US | VERTICAL IGFET WITH INTERNAL GATE AND METHOD FOR MAKING SAME |
| | 09/829,634 | Pending | US | POTTED TRANSDUCER ARRAY WITH MATCHING NETWORK IN A MULTIPLE PASS CONFIGURATION |
| | 09/799,845 | Pending | US | POWER TRENCH TRANSISTOR DEVICE SOURCE REGION FORMATION USING SILICON SPACER |
| | 09/839,374 | Pending | US | QUASI-RESONANT CONVERTER |
| | 09/815,672 | Pending | US | EDGE TERMINATION FOR SILICON POWER DEVICES |
| | 09/844,347 | Pending | US | POWER MOSFET AND METHOD FOR FORMING SAME USING A SELF-ALIGNED BODY IMPLANT |
| | 08/310,041 | Pending | US | FET, IGBT AND MCT STRUCTURES TO ENHANCE OPERATING CHARACTER |

-continued

EXHIBIT A

| Pat # | Apt # | Status | Country | Title |
|---|---|---|---|---|
| 5577656 | 462856 | Granted | US | METHOD OF PACKAGING A SEMICONDUCTOR DEVICE |
| | 09/731,169 | Pending | US | MOS-GATED POWER DEVICE WITH DOPED POLYSILICON BODY AND PROCESS FOR FORMING SAME |

What is claimed is:

1. A semiconductor device with a horizontal PN junction and having reduced cell pitch comprising:

a pair of spaced trenches of a first electrically conducting material surrounded by insulation in said integrated circuit;

a third trench between said pair of spaced trenches, said third trench filled with a metal to establish a metal contact with the semiconductor on both components of the PN junction along a generally vertical plane and in contact with a buried layer of the same type of dopant as the lower component of the PN junction and of a higher concentration than the lower component of the PN junction.

2. The semiconductor device of claim 1 having a dopant diffused from the bottom of said third trench into the semiconductor to thereby form the buried layer of high dopant concentration in contact with one of the components of the PN junction.

3. The semiconductor device of claim 2 wherein the metal in the third trench contacts the buried layer as well as both components of the PN junction.

4. A semiconductor device with a horizontal PN junction where the location of the FET break down occurs at the point other than said horizontal PN junction comprising:

a pair of spaced trenches of a first electrically conducting material surrounded by insulation in said semiconductor structure;

a third trench between said pair of spaced trenches;

a dopant diffused from the bottom of said third trench into the semiconductor to thereby form a layer of high dopant concentration; and, the third trench with a metal to establish a metal contact with said semiconductor structure on both components of the PN junction and with said layer of high dopant concentration along a generally vertical plane.

5. The semiconductor device of claim 4 wherein the layer of high dopant concentration is in contact with the component of said PN junction of the same conductivity.

* * * * *